(12) United States Patent
Sakamoto et al.

(10) Patent No.: US 8,759,948 B2
(45) Date of Patent: Jun. 24, 2014

(54) LASER BEAM MACHINING METHOD AND SEMICONDUCTOR CHIP

(71) Applicant: Hamamatsu Photonics K.K., Hamamatsu (JP)

(72) Inventors: Takeshi Sakamoto, Hamamatsu (JP); Kenichi Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/757,111

(22) Filed: Feb. 1, 2013

(65) Prior Publication Data

US 2013/0168831 A1 Jul. 4, 2013

Related U.S. Application Data

(62) Division of application No. 12/159,338, filed as application No. PCT/JP2006/325919 on Dec. 26, 2006, now Pat. No. 8,389,384.

(30) Foreign Application Priority Data

Dec. 27, 2005 (JP) ................................. 2005-375695

(51) Int. Cl.
*H01L 23/544* (2006.01)
(52) U.S. Cl.
USPC ............ 257/620; 257/E23.179; 257/E21.214; 438/463; 219/121.67; 219/121.68
(58) Field of Classification Search
None
See application file for complete search history.

(56) References Cited

U.S. PATENT DOCUMENTS

| | | | |
|---|---|---|---|
| 6,992,026 B2 | 1/2006 | Fukuyo et al. | |
| 7,396,742 B2 | 7/2008 | Fukuyo et al. | |
| 7,489,454 B2 | 2/2009 | Fukuyo et al. | |
| 7,547,613 B2 | 6/2009 | Fukuyo et al. | |

(Continued)

FOREIGN PATENT DOCUMENTS

| | | |
|---|---|---|
| EP | 1 338 371 A1 | 8/2003 |
| EP | 1 498 216 A1 | 1/2005 |

(Continued)

OTHER PUBLICATIONS

K. Hayashi; "Inner Glass Marking by Harmonics of Solid-State Laser", Proceedings of 45th Laser Materials Processing Conference, Dec. 1998, pp. 23-28.

(Continued)

*Primary Examiner* — Sonya D McCall Shepard
(74) *Attorney, Agent, or Firm* — Drinker Biddle & Reath LLP

(57) ABSTRACT

An object to be processed 1 comprising a substrate 4 and a plurality of functional devices 15 formed on a front face 3 of the substrate 4 is irradiated with laser light L while locating a converging point P within the substrate 4, so as to form at least one row of a divided modified region 72, at least one row of a quality modified region 71 positioned between the divided modified region 72 and the front face 3 of the substrate 4, and at least one row of an HC modified region 73 positioned between the divided modified region 72 and a rear face 21 of the substrate 4 for one line to cut 5. Here, in a direction along the line to cut, a forming density of the divided modified region 72 is made lower than that of the quality modified region 71 and that of the HC modified region 73.

1 Claim, 26 Drawing Sheets

(56) References Cited

U.S. PATENT DOCUMENTS

| | | |
|---|---|---|
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2005/0009301 A1 | 1/2005 | Nagai et al. |
| 2005/0202596 A1 | 9/2005 | Fukuyo et al. |
| 2005/0272223 A1 | 12/2005 | Fujii et al. |
| 2006/0144828 A1 | 7/2006 | Fukumitsu et al. |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| EP | 1 580 800 A1 | 9/2005 |
| JP | 2002-205180 A | 7/2002 |
| JP | 2003-001458 A | 1/2003 |
| JP | 2003-001473 A | 1/2003 |
| JP | 2003-039186 A | 2/2003 |
| JP | 2007-160400 A | 6/2007 |
| WO | WO-03/076119 A1 | 9/2003 |
| WO | WO-2004/051721 A1 | 6/2004 |
| WO | WO-2005/098915 A1 | 10/2005 |

OTHER PUBLICATIONS

K. Miura et al., "Formation of Photo-Induced Structures in Glasses with Femtosecond Laser", Proceedings of 42nd Laser Materials Processing Conference, Nov. 1997, pp. 105-111.

T. Sano et al., "Evaluation of Processing Characteristics of Silicon with Picosecond Pulse Laser", Preprints of the National Meeting of Japan Welding Society, No. 66, Apr. 2000, pp. 72-73 (with at least partial English translation).

U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.

(a)

(b)

(a)

(b)

(a)

(b)

LASER BEAM MACHINING METHOD AND SEMICONDUCTOR CHIP

This is a divisional application of copending application Ser. No. 12/159,338, filed on Feb. 9, 2009, which is a national stage application of PCT Application No. PCT/JP2006/325919 filed on Dec. 26, 2006, designating the U.S.A., the entire contents of each of which are incorporated by reference herein in their entirety.

TECHNICAL FIELD

The present invention relates to a laser processing method used for cutting an object to be processed comprising a substrate and a plurality of functional devices formed on a front face of the substrate along a line to cut, and a semiconductor chip cut by using such a laser processing method.

BACKGROUND ART

Conventionally known as this kind of art is a laser processing method which irradiates a wafer-like object to be processed with laser light while locating a converging point within the object, thereby forming a plurality of rows of modified regions within the object along a line to cut and using the modified regions as a cutting start point (see Patent Document 1, for example).
Patent Document 1: Japanese Patent Application Laid-Open No. 2002-205180

DISCLOSURE OF THE INVENTION

Problem to be Solved by the Invention

The laser processing method such as the one mentioned above is a technique which becomes particularly effective when the object to be processed is thick. This is because even a thick object to be processed can be cut accurately along the line to cut by increasing the number of rows of modified regions along the line to cut. Such a technique has been demanded to shorten the processing time while keeping the cutting quality.

In view of such circumstances, it is an object of the present invention to provide a laser processing method which can cut an object to be processed comprising a substrate and a plurality of functional devices formed on a front face of the substrate along a line to cut accurately in a short time even when the substrate is thick, and a semiconductor chip cut by using such a laser processing method.

Means for Solving Problem

For achieving the above-mentioned object, in one aspect, the present invention provides a laser processing method of irradiating an object to be processed comprising a substrate and a plurality of functional devices formed on a front face of the substrate with laser light while locating a converging point within the substrate, so as to form a modified region to become a cutting start point within the substrate along a line to cut the object; the method including the step of forming at least one row of a first modified region, at least one row of a second modified region positioned between the first modified region and the front face of the substrate, and at least one row of a third modified region positioned between the first modified region and a rear face of the substrate; wherein a forming density of the first modified region in a direction along the line to cut is lower than that of the second modified region and that of the third modified region in the direction along the line to cut.

In this laser processing method, the forming density of the first modified region in a direction along the line to cut is lower than that of the second modified region and that of the third modified region in this direction. This can reduce the time required for forming the first, second, and third modified regions as compared with the case where the forming density of the first modified region is equal to that of the second modified region and that of the third modified region. Meanwhile, the second modified region, which is positioned between the first modified region and the front face of the substrate, and the third modified region, which is positioned between the first modified region and the rear face of the substrate, are more influential on the cutting quality of the object than is the first modified region. However, since the forming densities of the second and third modified regions in the direction along the line to cut are made higher than the forming density of the first modified region in the direction along the line to cut, the cutting quality of the object can be prevented from deteriorating. Because of the foregoing, this laser processing method can cut an object to be processed comprising a substrate and a plurality of functional devices formed on the front face of the substrate along a line to cut accurately in a short time even when the substrate is thick.

The functional devices herein refer to semiconductor operating layers formed by crystal growth, light-receiving devices such as laser diodes, circuit devices formed as circuits, and the like, for example. The forming density of the modified region in the direction along the line to cut (hereinafter simply referred to as "forming density of the modified region") refers to the ratio at which the modified region is distributed per unit length in the direction along the line to cut.

The first, second, and third modified regions can be formed in any order. The first, second, and third modified regions are formed by generating multiphoton absorption or other kinds of absorption within the substrate by irradiating the substrate with the laser light while locating the converging point within the substrate.

When irradiating the substrate with the laser light while using the rear face of the substrate as a laser light entrance surface and locating the converging point within the substrate in the above-mentioned laser processing method, it will be preferred if the second modified region is formed such that an end part on the front face side of the second modified region and the front face of the second modified region are separated from each other by a distance of 5 μm to 20 μm. When the second modified region is formed as such, even a multilayer part formed on the line to cut in the front face of the substrate, if any, can be cut accurately along the line to cut together with the substrate.

Preferably, the third modified region is formed such that a fracture along the line to cut occurs from the third modified region to the rear face of the substrate. When the third modified region is formed as such, the fracture generated from the third modified region to the rear face of the substrate proceeds smoothly toward the front face of the substrate through the first and second modified regions at the time of expanding an expandable tape attached to the rear face of the substrate, for example, whereby the object can be cut accurately along the line to cut.

The above-mentioned laser processing method encompasses a case where the substrate is a semiconductor substrate, while the first, second, and third modified regions include a molten processed region. When the substrate is a semiconductor substrate, a modified region including a molten processed region may be formed as the first, second, and third modified regions.

The above-mentioned laser processing method may further comprise the step of cutting the object into the functional devices along the line to cut. Because of the reason mentioned above, the object can be cut accurately in a short time into the functional devices even when the substrate is thick.

In another aspect, the present invention provides a laser processing method of irradiating an object to be processed comprising a substrate and a plurality of functional devices formed on a front face of the substrate with laser light while locating a converging point within the substrate, so as to form a modified region to become a cutting start point within the substrate along a line to cut the object; the method including the step of forming at least one row of a first modified region, at least one row of a second modified region positioned between the first modified region and the front face of the substrate, and at least one row of a third modified region positioned between the first modified region and a rear face of the substrate; wherein, when forming the first modified region, the laser light is moved relative to the object along the line to cut at a rate faster than that at the time of forming the second and third modified regions.

This laser processing method can make the forming density of the first modified region lower than that of the second modified region and that of the third modified region. Therefore, this laser processing method can cut an object to be processed comprising a substrate and a plurality of functional devices formed on the front face of the substrate along a line to cut accurately in a short time even when the substrate is thick as with the former laser processing method.

In still another aspect, the present invention provides a semiconductor chip comprising a substrate and a functional device formed on a front face of the substrate; wherein a side face of the substrate is formed with at least one row of a first modified region, at least one row of a second modified region positioned between the first modified region and the front face of the substrate, and at least one row of a third modified region positioned between the first modified region and a rear face of the substrate; and wherein a forming density of the first modified region in a direction orthogonal to a thickness direction of the substrate is lower than that of the second modified region and that of the third modified region in the direction orthogonal to the line to cut.

Since this semiconductor chip is considered to be one cut by using the above-mentioned laser processing methods, the side face of the substrate formed with the first, second, and third modified regions is a high-precision cut section in which irregularities are suppressed.

Effect of the Invention

The present invention can cut an object to be processed comprising a substrate and a plurality of functional devices formed on the front face of the substrate along a line to cut accurately in a short time even when the substrate is thick.

EXPLANATIONS OF NUMERALS OR LETTERS

1 . . . object to be processed; 3 . . . front face; 4 . . . substrate; 4a . . . cut section (side face); 5 . . . line to cut; 15 . . . functional device; 21 . . . rear face; 24 . . . fracture; 25 . . . semiconductor chip; 71 . . . quality modified region; 71a . . . front-side end part; 72 . . . divided modified region; 73 . . . HC modified region; 73a . . . front-side end part; 74 . . . auxiliary HC modified region; L . . . laser light; P . . . converging point

BEST MODES FOR CARRYING OUT THE INVENTION

In the following, preferred embodiments of the present invention will be explained in detail with reference to the drawings. In the laser processing methods in accordance with the embodiments, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is $hv > E_G$. However, even when optically transparent, the material generates absorption under a condition of $nhv > E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 1:
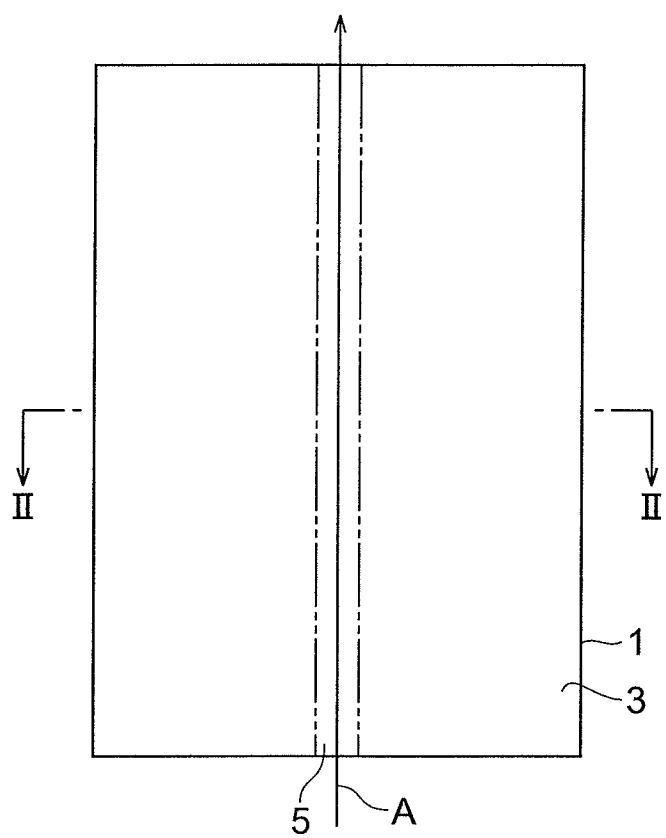
FIG. 1 is a plan view of an object to be processed during laser processing by the laser processing method in accordance with an embodiment.
Figure 2:
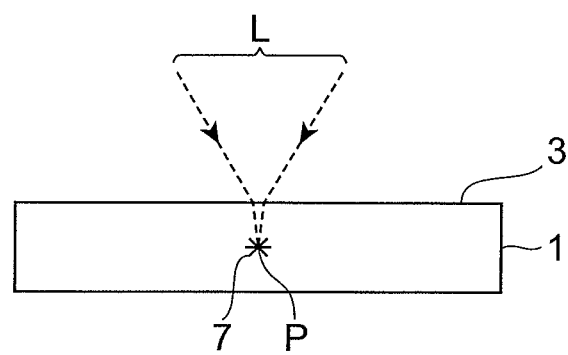
FIG. 2 is a sectional view of the object taken along the line II-II of FIG. 1.

The principle of the laser processing method in accordance with the embodiment using such multiphoton absorption will be explained with reference to FIGS. 1 to 6. As shown in FIG. 1, on a front face 3 of a planar object to be processed 1, a line to cut 5 for cutting the object 1 exists. The line to cut 5 is a virtual line extending straight. As shown in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 3:
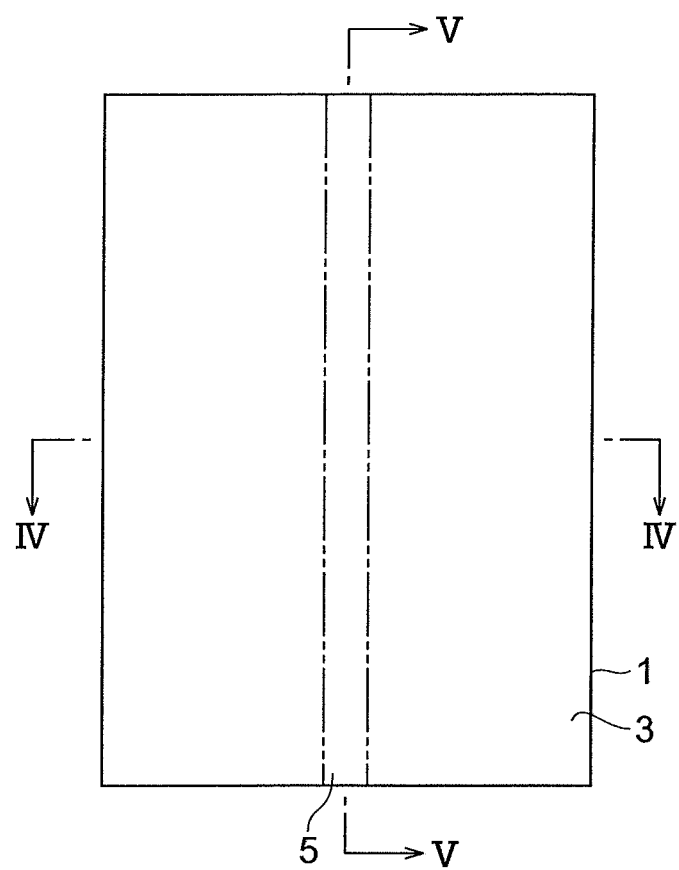
FIG. 3 is a plan view of the object after the laser processing by the laser processing method in accordance with the embodiment.
Figure 4:
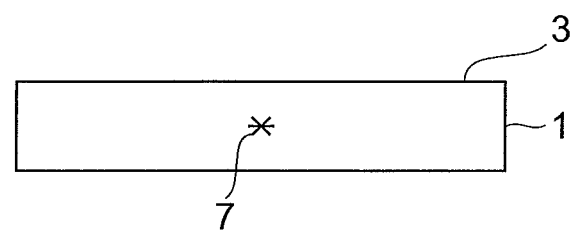
FIG. 4 is a sectional view of the object taken along the line IV-IV of FIG. 3.
Figure 5:
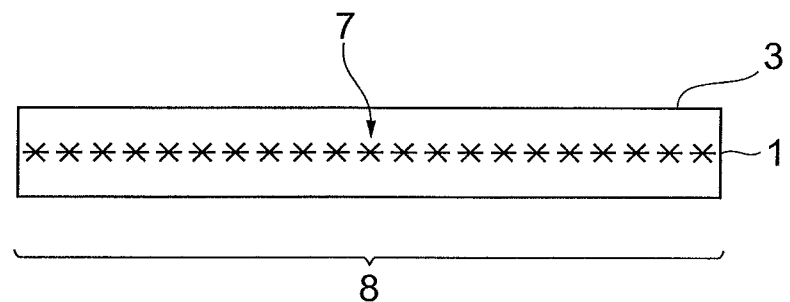
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as shown in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the modified region 7 is not formed by the heat generated from the object 1 absorbing the laser light L. The laser light L is transmitted through the object 1, so as to generate multiphoton absorption therewithin, thereby forming the modified region 7. Therefore, the front face 3 of the object 1 hardly absorbs the laser light L and does not melt.

Figure 6:
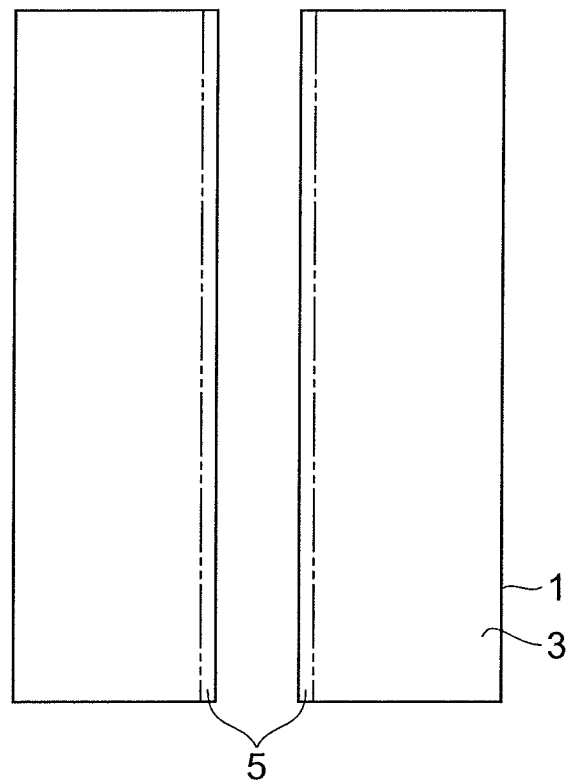
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as shown in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress on the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 such as silicon wafer has recently been apt to decrease its thickness.

The modified region formed by multiphoton absorption in the laser processing method in accordance with this embodiment encompasses the following cases (1) to (4):

(1) Case where the Modified Region is a Crack Region Including One Crack or a Plurality of Cracks An object to be processed (e.g., glass or a piezoelectric material made of LiTaO$_3$) is irradiated with laser light while locating a converging point therewithin under a condition with a field intensity of at least 1×10$^8$ (W/cm$^2$) at the converging point and a pulse width of 1 μs or less. This magnitude of pulse width is a condition under which a crack region can be formed only within the object while generating multiphoton absorption without causing unnecessary damages on the front face of the object. This generates a phenomenon of optical damage by multiphoton absorption within the object. This optical damage induces a thermal distortion within the object, thereby forming a crack region therewithin. The upper limit of field intensity is $1\times10^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser Harmonics", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)

(B) Laser
light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: output<1 mJ/pulse
laser light quality: TEM$_{00}$
polarizing property: linear polarization (C) Condenser lens
transmittance at a laser light wavelength: 60%

(D) Moving rate of the mount table mounting the object: 100 mm/sec

The laser light quality of TEM$_{00}$ means that the converging characteristic is so high that convergence to about the wavelength of laser light is possible.

Figure 7:
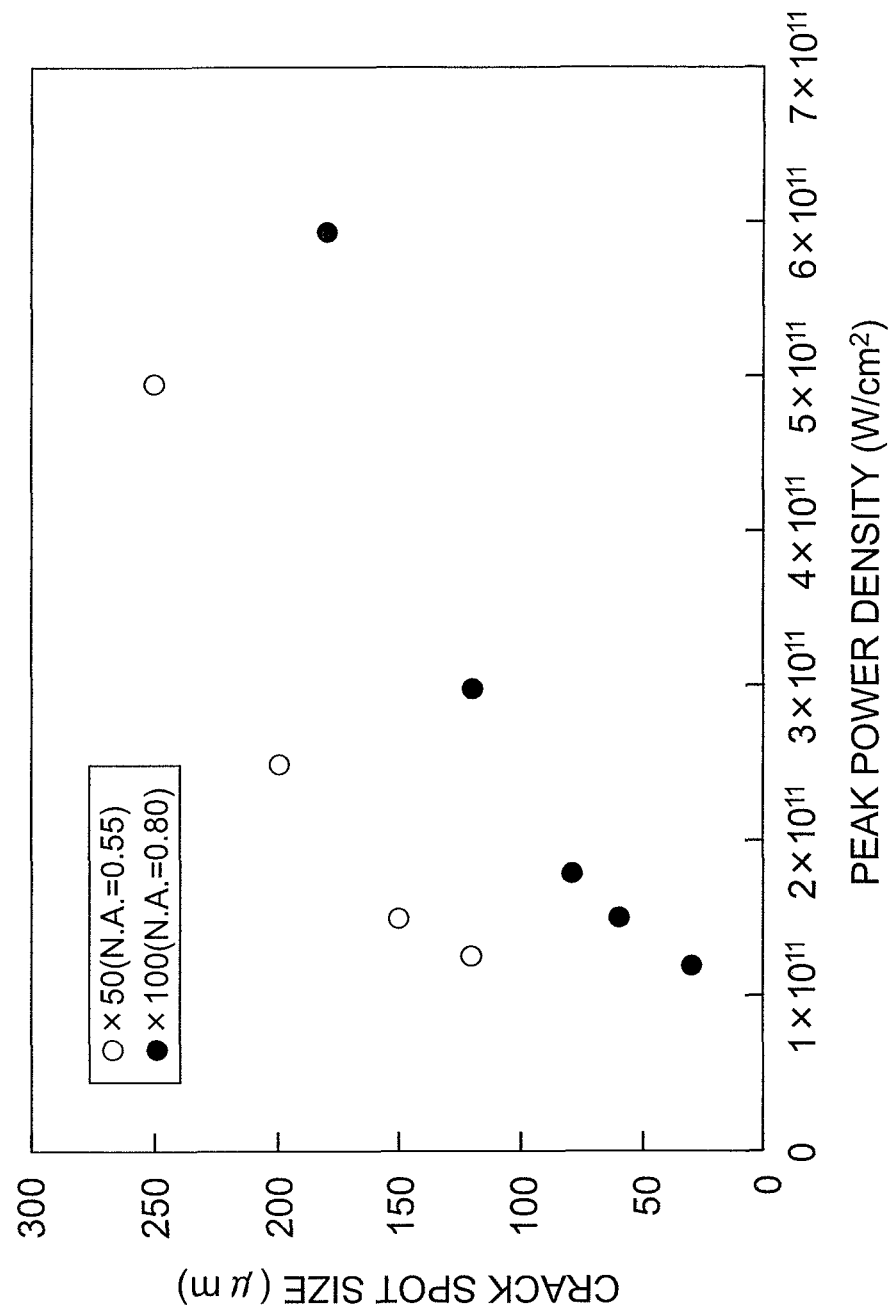
FIG. 7 is a graph showing relationships between the field intensity and crack spot size in the laser processing method in accordance with the embodiment.

FIG. 7 is a graph showing the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 8:
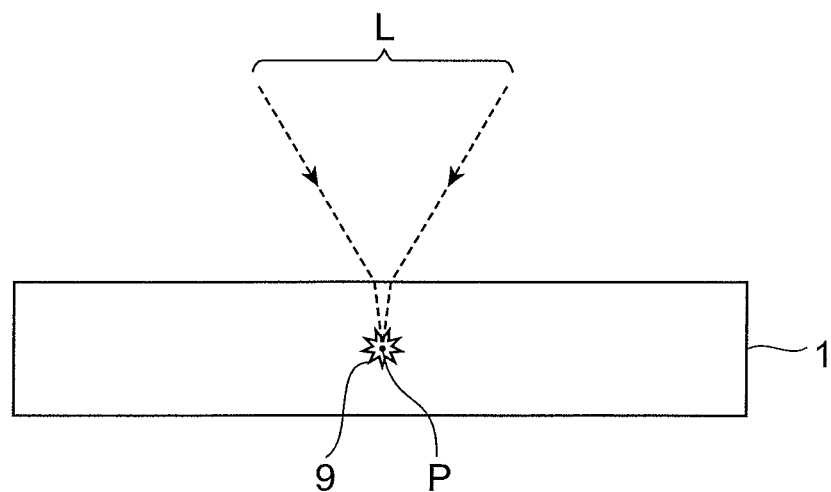
FIG. 8 is a sectional view of the object in a first step of the laser processing method in accordance with the embodiment.
Figure 9:
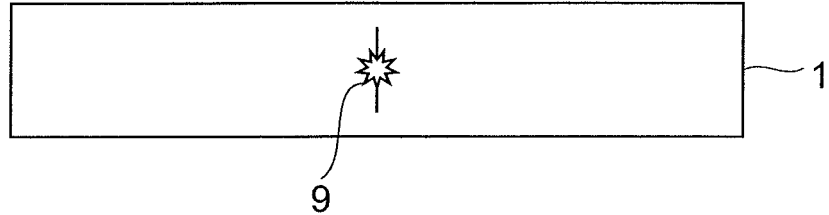
FIG. 9 is a sectional view of the object in a second step of the laser processing method in accordance with the embodiment.
Figure 10:
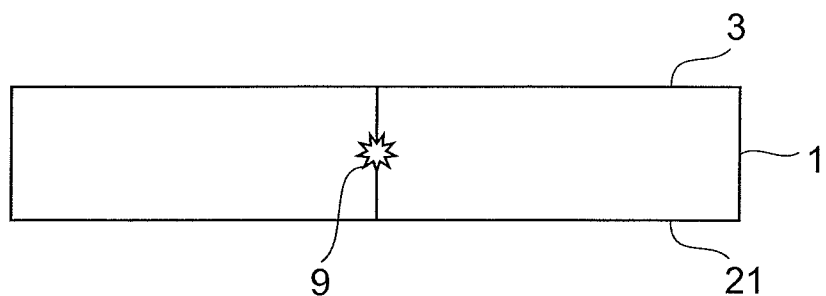
FIG. 10 is a sectional view of the object in a third step of the laser processing method in accordance with the embodiment.
Figure 11:
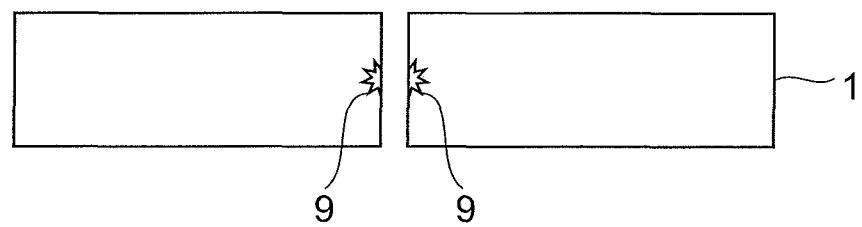
FIG. 11 is a sectional view of the object in a fourth step of the laser processing method in accordance with the embodiment.

A mechanism by which the object to be processed is cut by forming a crack region will now be explained with reference to FIGS. 8 to 11. As shown in FIG. 8, the object 1 is irradiated with laser light L while the converging point P is located within the object 1 under a condition where multiphoton absorption occurs, so as to form a crack region 9 therewithin along a line to cut. The crack region 9 is a region containing one crack or a plurality of cracks. Thus formed crack region 9 becomes a starting point region for cutting. A crack further grows from the crack region 9 acting as a start point (i.e., from the starting point region for cutting acting as a start point) as shown in FIG. 9, and reaches the front face 3 and rear face 21 of the object 1 as shown in FIG. 10, whereby the object 1 fractures and is consequently cut as shown in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a converging point within the object under a condition with a field intensity of at least $1\times10^{8}$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer. The following are conditions of the experiment.

(A) Object to be processed: silicon wafer (with a thickness of 350 μm and an outer diameter of 4 inches)

(B) Laser
light source: semiconductor laser pumping Nd:YAG laser
wavelength: 1064 nm
laser light spot cross-sectional area: $3.14\times10^{-8}$ cm$^2$
oscillation mode: Q-switched pulse
repetition frequency: 100 kHz
pulse width: 30 ns
output: 20 μJ/pulse
laser light quality: TEM$_{00}$
polarizing property: linear polarization (C) Condenser lens
magnification: ×50
N.A.: 0.55
transmittance at a laser light wavelength: 60%

(D) Moving rate of the mount table mounting the object: 100 mm/sec

Figure 12:
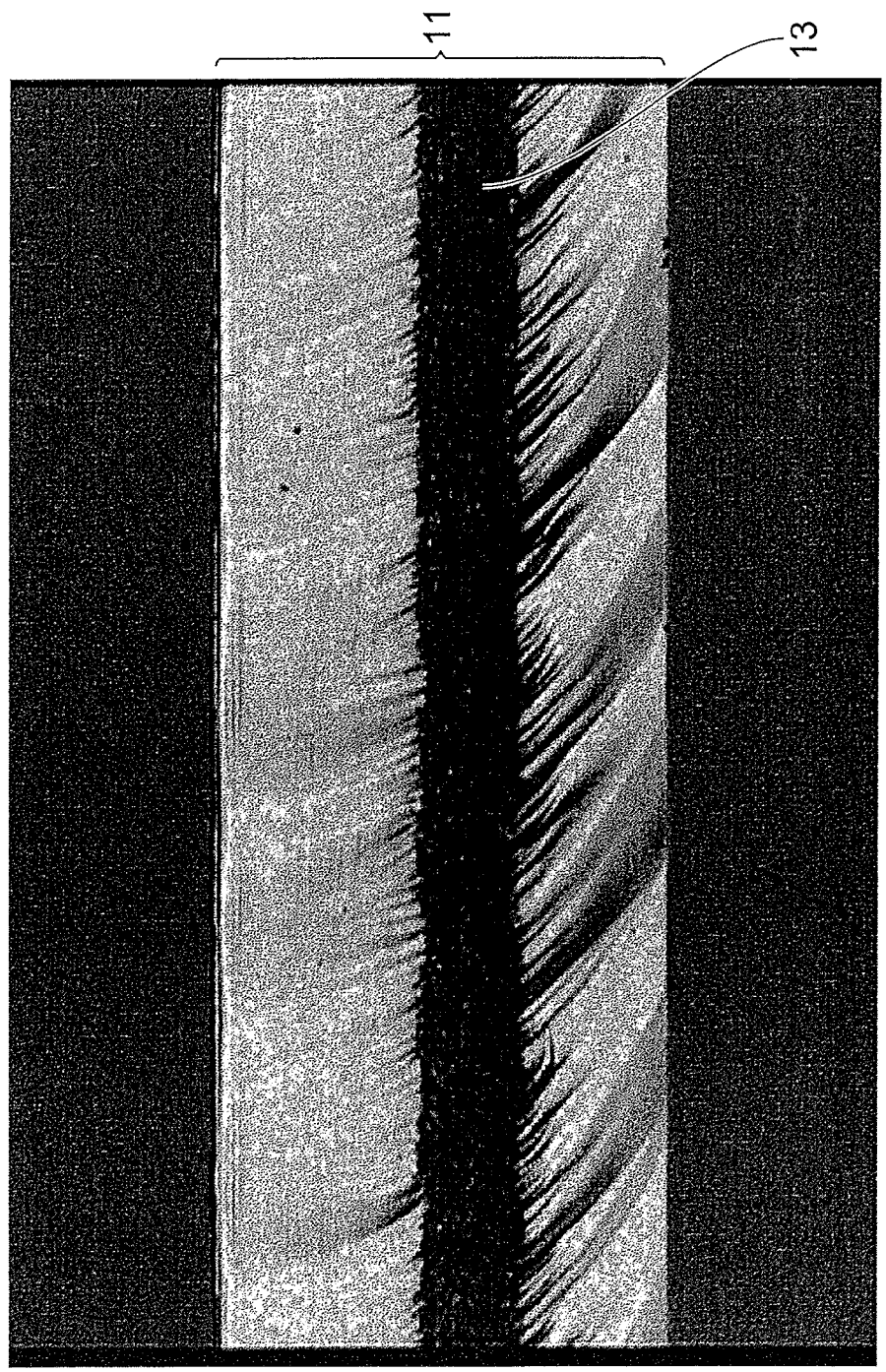
FIG. 12 is a view showing a photograph of a cut section in a part of a silicon wafer cut by the laser processing method in accordance with the embodiment.

FIG. 12 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
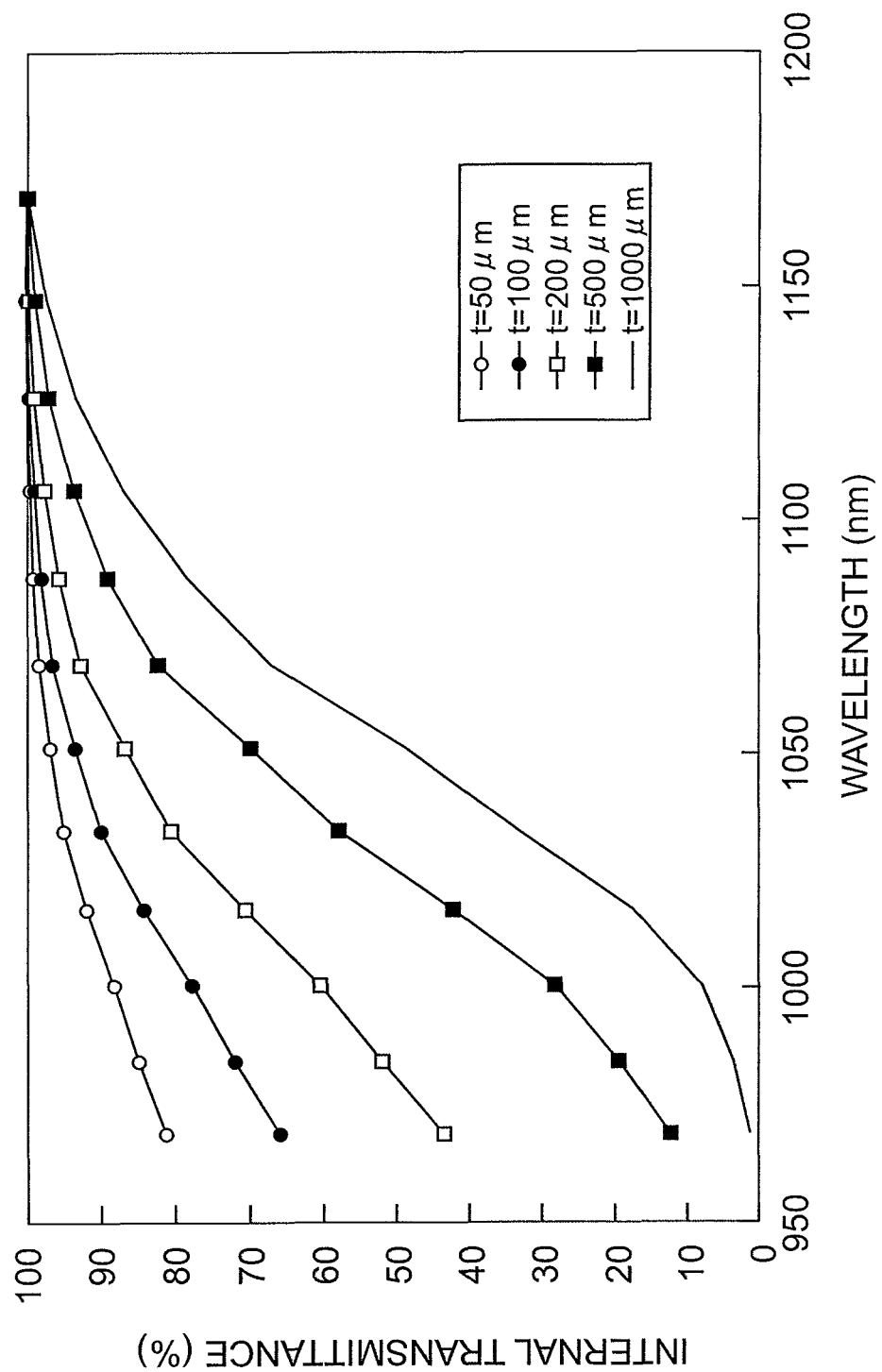
FIG. 13 is a graph showing relationships between the laser light wavelength and the transmittance within a silicon substrate in the laser processing method in accordance with the embodiment.

The fact that the molten processed region 13 is formed by multiphoton absorption will now be explained. FIG. 13 is a graph showing relationships between the laser light wavelength and the transmittance within the silicon substrate. Here, the respective reflected components on the front and rear face sides of the silicon substrate are eliminated, so as to show the internal transmittance alone. The respective relationships are shown in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 shown in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state where the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as shown in FIG. 12. When a starting point region for cutting is thus formed within the object by a molten processed region, unnecessary fractures deviating from a starting point region for cutting line are harder to occur at the time of cleaving, whereby cleavage control becomes easier.

(3) Case where the Modified Region is Formed by a Molten Processed Region and a Microcavity An object to be processed (e.g., semiconductor material such as silicon) is irradiated with laser light while locating a converging point within the object under a condition with a field intensity of at least $1 \times 10^8$ (W/cm$^2$) at the converging point and a pulse width of 1 μs or less. This may form a molten processed region and a microcavity within the object. The upper limit of field intensity is $1 \times 10^{12}$ (W/cm$^2$), for example. The pulse width is preferably 1 ns to 200 ns, for example.

Figure 14:
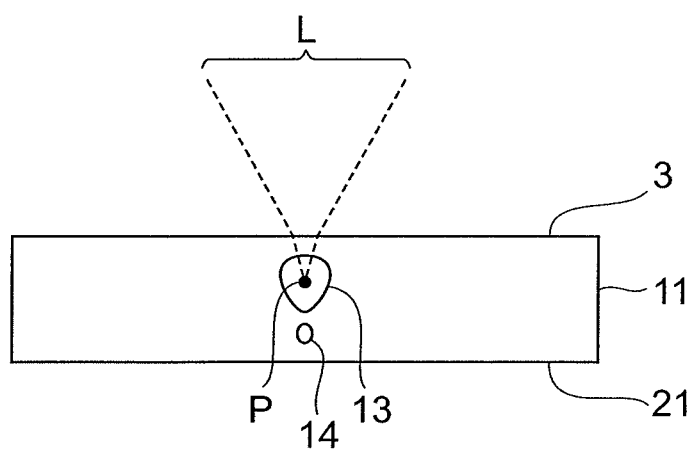
FIG. 14 is a sectional view showing a silicon wafer formed with a molten processed region and a microcavity by the laser processing method in accordance with the embodiment.

When laser light L is incident on a silicon wafer 11 from its front face 3 side as shown in FIG. 14, a microcavity 14 is formed on the rear face 21 side of the molten processed region 13. The molten processed region 13 and the microcavity 14 are separated from each other in FIG. 14, but may be formed continuously as well. Namely, when the molten processed region 13 and the microcavity 14 are formed as a pair by multiphoton absorption, the microcavity 14 is formed on the opposite side of the molten processed region 13 from the laser light entrance surface in the silicon wafer 11.

It is not completely clear by what principle the microcavity 14 is thus formed so as to correspond to each molten processed region 13 formed by generating multiphoton absorption within the silicon wafer 11 by transmitting the laser light L therethrough. Two hypotheses assumed by the inventors concerning the principle by which the molten processed region 13 and the microcavity 14 are formed as a pair will now be explained.

Figure 15:
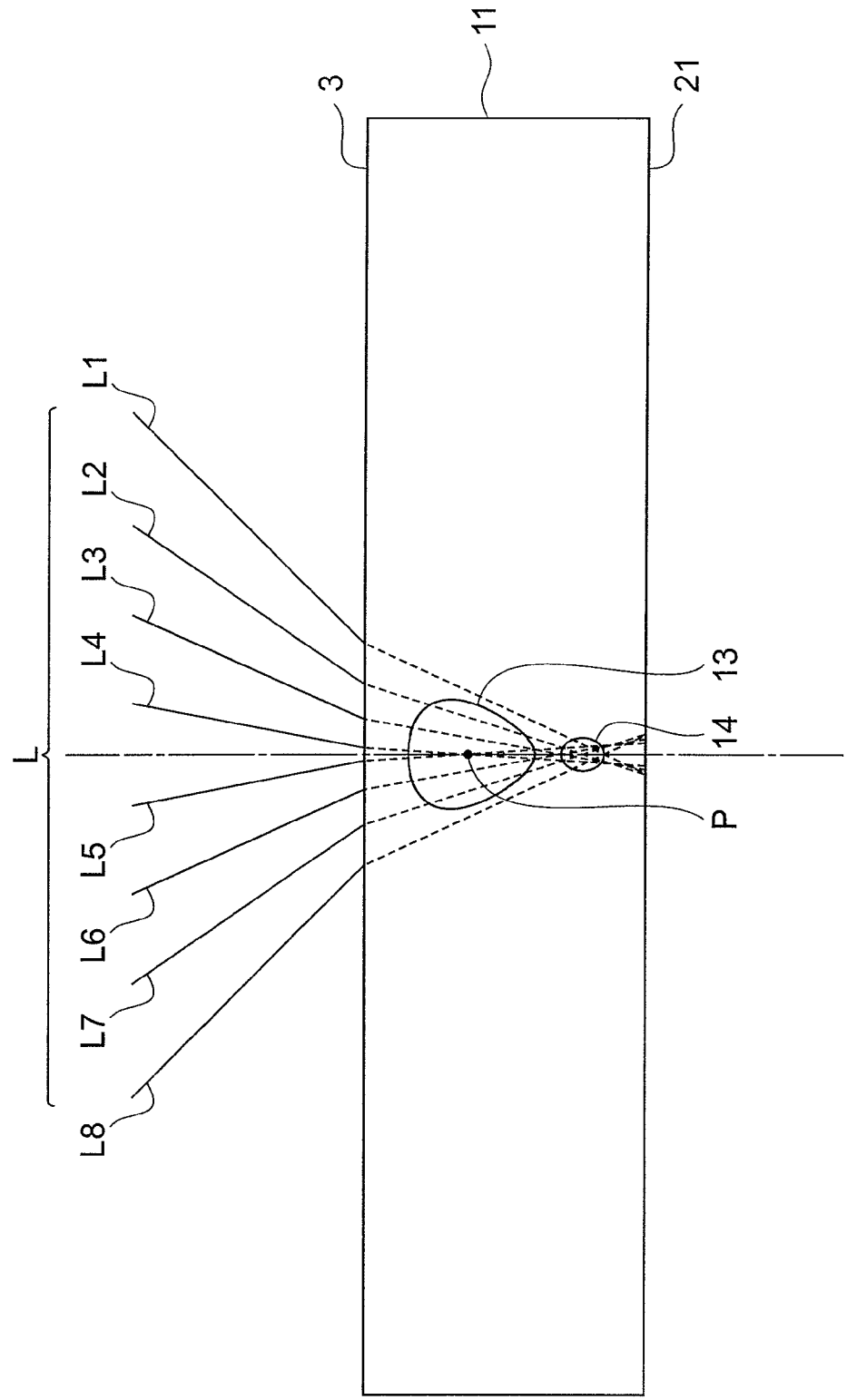
FIG. 15 is a sectional view of a silicon wafer for explaining a principle by which the molten processed region and microcavity are formed by the laser processing method in accordance with the embodiment.

The first hypothesis assumed by the inventors is as follows. Namely, when the silicon wafer 11 is irradiated with the laser light L focused at a converging point P within the silicon wafer 11 as shown in FIG. 15, the molten processed region 13 is formed near the converging point P. Conventionally, light components in the center part of the laser light L emitted from a laser light source (light components corresponding to L4 and L5 in FIG. 15) have been used as the laser light L. This aims at using the center part of a Gaussian distribution of the laser light L.

The inventors have tried to expand the laser light L in order to restrain the laser light L from affecting the front face 3 of the silicon wafer 11. In one technique therefor, the laser light L emitted from the laser light source is expanded by a predetermined optical system, so as to widen the skirt of the Gaussian distribution, thereby relatively raising the laser intensity of light components in a peripheral part of the laser light L (those corresponding to L1 to L3 and L6 to L8 in FIG. 15). When thus expanded laser light L is transmitted through the silicon wafer 11, the molten processed region 13 is formed near the converging point P, and the microcavity 14 is formed at a part corresponding to the molten processed region 13 as explained above. Namely, the molten processed region 13 and the microcavity 14 are formed at respective positions on the optical axis (dash-dot line in FIG. 15) of the laser light L. The position at which the microcavity 14 is formed corresponds to a location where light components in the peripheral part of the laser light L (those corresponding to L1 to L3 and L6 to L8 in FIG. 15) are theoretically converged.

The spherical aberration of a lens converging the laser light L seems to cause light components in the center part of the laser light L (those corresponding to L4 and L5 in FIG. 15) and light components in the peripheral part of the laser light L (those corresponding to L1 to L3 and L6 to L8 in FIG. 15) to converge at respective locations different from each other in the thickness direction of the silicon wafer 11 as in the foregoing. The first hypothesis assumed by the inventors lies in that the difference in converging positions may have some effects.

The second hypothesis assumed by the inventors lies in that, since the portion where light components in the peripheral part of the laser light L (those corresponding to L1 to L3 and L6 to L8 in FIG. 15) are converged is a theoretical laser-converging point, the light intensity is so high in this portion that minute structural changes occur, thereby forming the microcavity 14 whose periphery does not substantially change its crystal structure, whereas the portion formed with the molten processed region 13 is thermally affected so much that it is simply molten and re-solidified.

Here, the molten processed region 13 is as stated in the above (2), whereas the microcavity 14 is one whose periphery does not substantially change its crystal structure. When the silicon wafer 11 has a silicon monocrystal structure, the periphery of the microcavity 14 mostly keeps the silicon monocrystal structure.

By an experiment, the inventors verified that the molten processed region 13 and microcavity 14 were formed within the silicon wafer 11. The following are conditions of the experiment.

(A) Object to be processed: silicon wafer (with a thickness of 100 μm)

(B) Laser light source: semiconductor laser pumping Nd:YAG laser wavelength: 1064 nm repetition frequency: 40 kHz pulse width: 30 ns pulse pitch: 7 μm processing depth: 8 μm pulse energy: 50 μJ/pulse (C) Condenser lens

N.A.: 0.55

(D) Moving rate of the mount table mounting the object: 280 mm/sec

Figure 16:
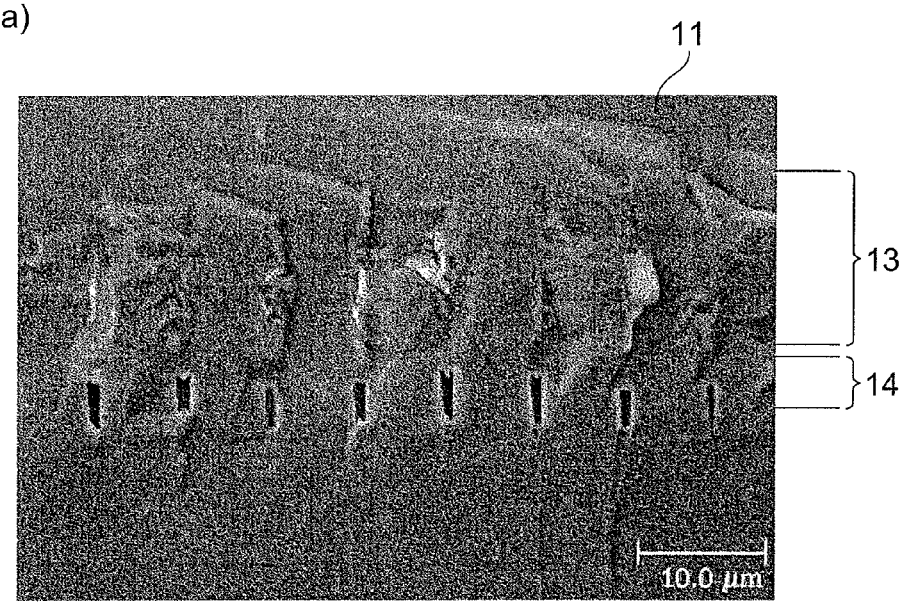
FIG. 16 is a view showing photographs of a cut section of a silicon wafer formed with molten processed regions and microcavities by the laser processing method in accordance with the embodiment.
Figure 16:
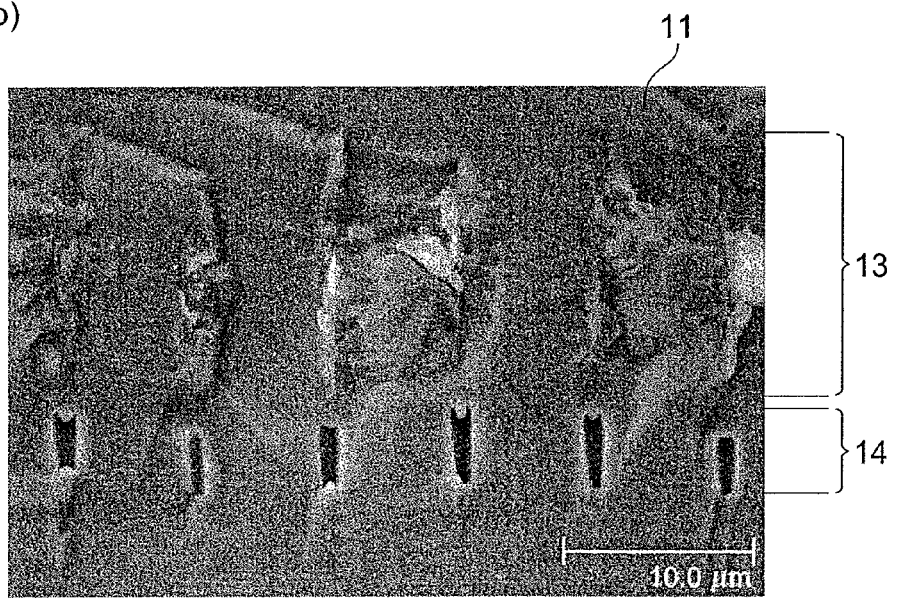

FIG. 16 is a view showing photographs of a cut section of the silicon wafer 11 cut by laser processing under the above-mentioned conditions. In FIG. 16, (a) and (b) are photographs showing the same cut section on different scales. As depicted, within the silicon wafer 11, pairs of molten processed regions 13 and microcavities 14, each pair being formed by irradiation with one pulse of laser light L, are positioned at a predetermined pitch along the cross section (i.e., along a line to cut).

Each molten processed region 13 in the cut section shown in FIG. 16 has a width of about 13 μm in the thickness direction of the silicon wafer 11 (the vertical direction in the drawing) and a width of about 3 μm in the moving direction of laser light L (the horizontal direction in the drawing). Each microcavity 14 has a width of about 7 μm in the thickness direction of the silicon wafer 11 and a width of about 1.3 μm in the moving direction of laser light L. The gap between the molten processed region 13 and microcavity 14 is about 1.2 μm.

(4) Case where the Modified Region is a Refractive Index Change Region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

The cases (1) to (4) are explained in the foregoing as a modified region formed by multiphoton absorption. A starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

Namely, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the direction to be formed therewith, the starting point region for cutting extending in the direction to be formed with the starting point region for cutting can be formed easily and accurately with reference to the orientation flat.

First Embodiment

Figure 17:
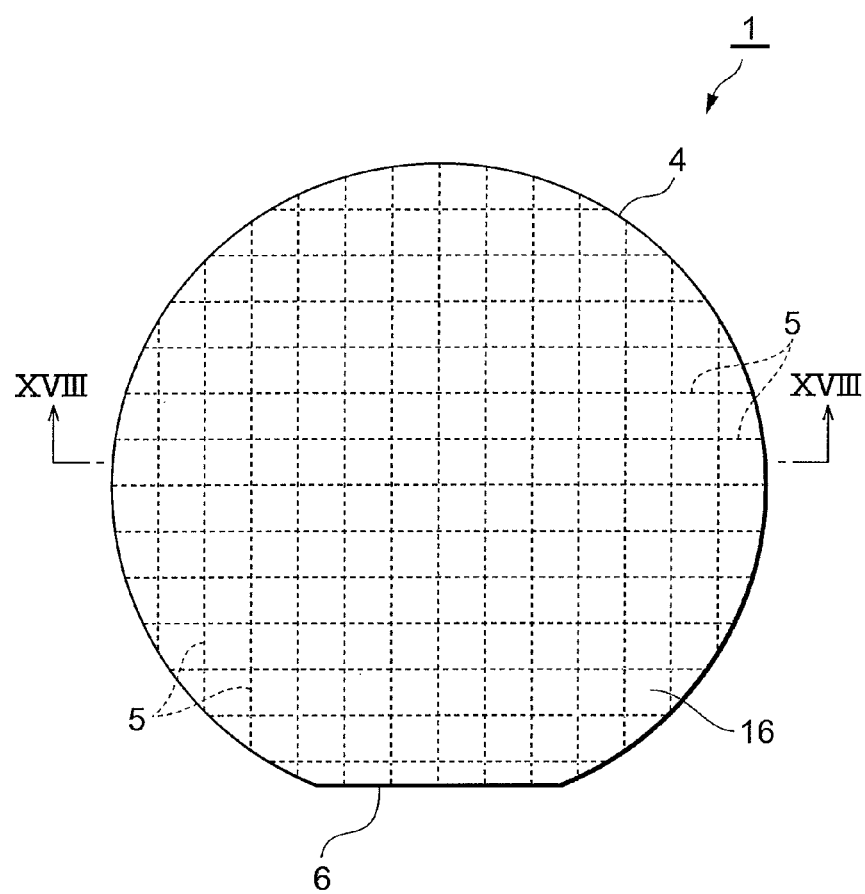
FIG. 17 is a plan view of the object to be processed in the laser processing method in accordance with a first embodiment.

The first embodiment of the present invention will now be explained. FIG. 17 is a plan view of the object to be processed in the laser processing method in accordance with this embodiment, whereas FIG. 18 is a sectional view of a part of the object taken along the line XVIII-XVIII of FIG. 17.

Figure 18:
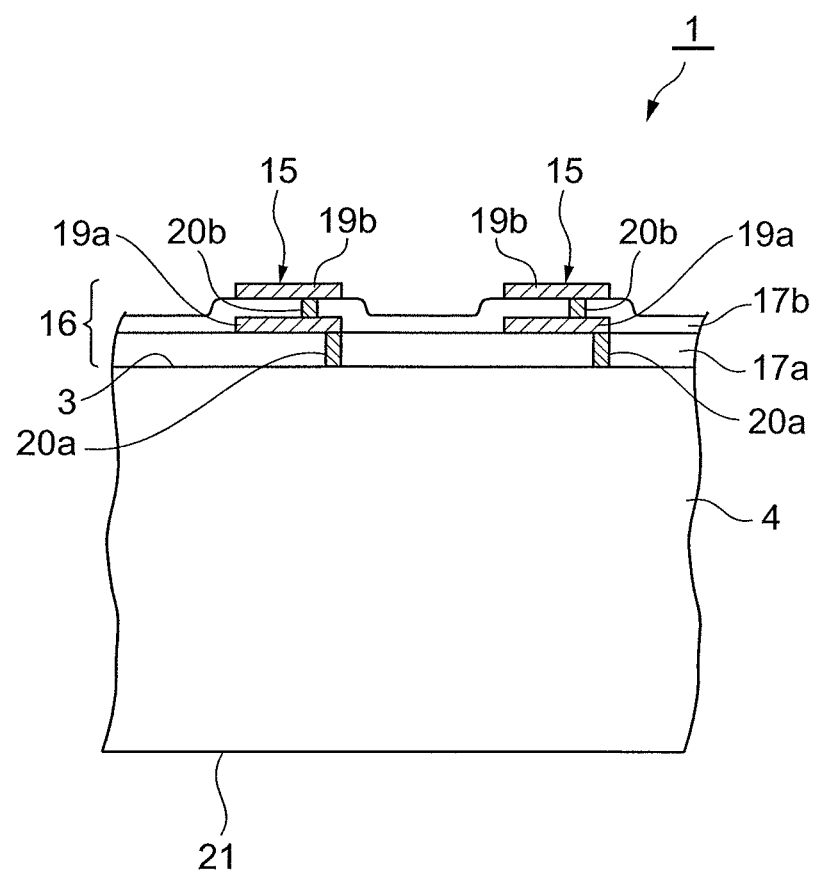
FIG. 18 is a sectional view of a part of the object taken along the line XVIII-XVIII of FIG. 17.

As shown in FIGS. 17 and 18, the object 1 comprises a substrate 4 made of silicon having a thickness of 30 μm and an outer diameter of 6 inches, and a multilayer part 16 which is formed on the front face 3 of the substrate 4 while including a plurality of functional devices 15. The functional devices 15 have an interlayer insulating film 17a laminated on the front face 3 of the substrate 4, a wiring layer 19a arranged on the interlayer insulating film 17a, an interlayer insulating film 17b laminated on the interlayer insulating film 17a so as to cover the wiring layer 19a, and a wiring layer 19b arranged on the interlayer insulating film 17b. The wiring layer 19a and the substrate 4 are electrically connected to each other by a conductive plug 20a penetrating through the interlayer insulating film 17a, whereas the wiring layers 19a and 19b are electrically connected to each other by a conductive plug 20b penetrating through the interlayer insulating film 17b.

While a number of functional devices 15 are formed like a matrix in directions parallel and perpendicular to an orientation flat 6 of the substrate 4, the interlayer insulating films 17a, 17b are formed between the functional devices 15, 15 adjacent to each other so as to cover the front face 3 of the substrate 4 as a whole.

Figure 19:
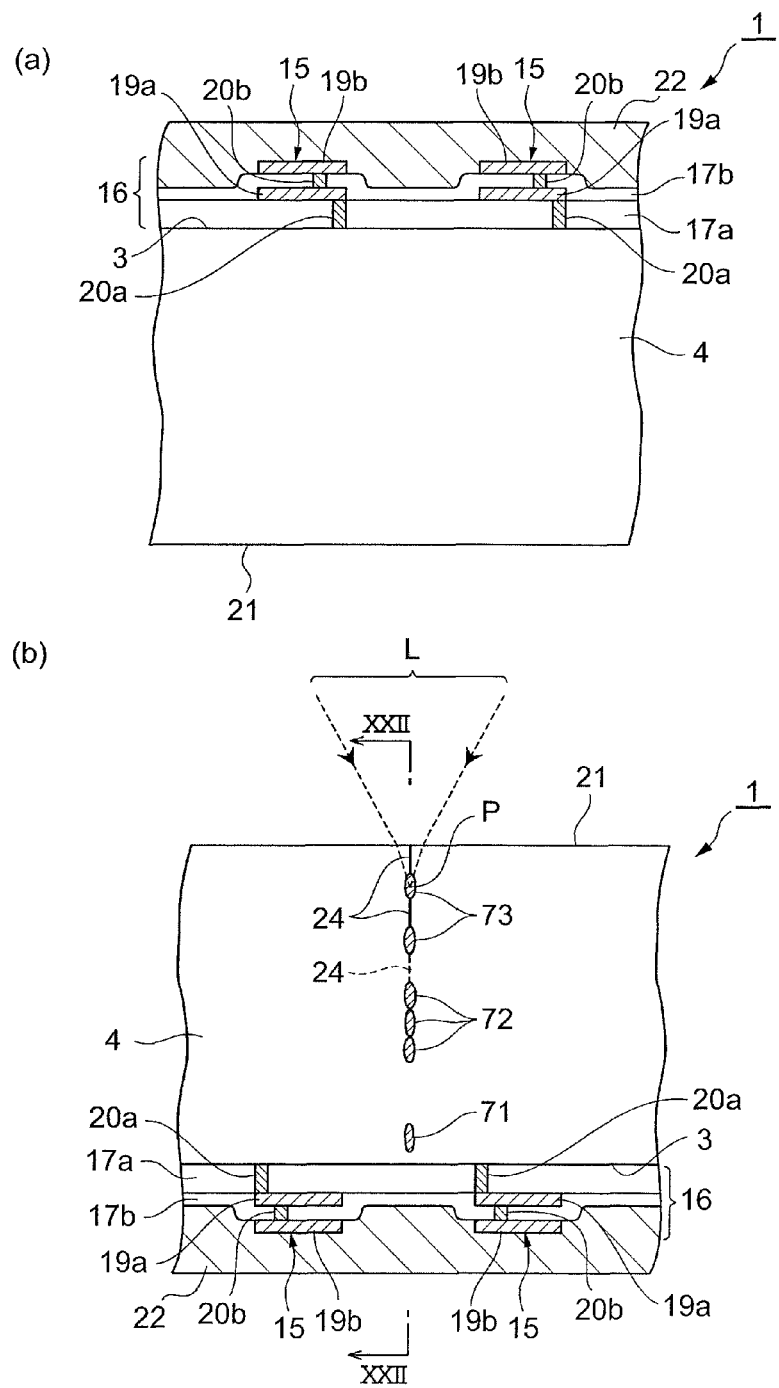
FIG. 19 is a view for explaining the laser processing method in accordance with the first embodiment, in which (a) is a state where a protective tape is attached to the object, and (b) is a state where the object is irradiated with laser light.

Thus constructed object 1 is cut into the functional devices 15 (cut into thin square sheet-like chips each having a size of 5 mm×5 mm here when seen two-dimensionally) as follows. First, as shown in FIG. 19(a), a protective tape 22 is attached to the object 1 so as to cover the multilayer part 16. Subsequently, as shown in FIG. 19(b), the object 1 is fixed onto a mount table (not depicted) of a laser processing apparatus such that the rear face 21 faces up. Here, the protective tape 22 keeps the multilayer part 16 from coming into direct contact with the mount table, whereby each functional device 15 can be protected.

Then, lines to cut 5 are set like grids (see broken lines in FIG. 17) at intervals of 5 mm so as to pass between the functional devices 15, 15 adjacent to each other, and the substrate 4 is irradiated with laser light L under a condition generating multiphoton absorption while using the rear face 21 as a laser light entrance surface and locating a converging point P within the substrate 4. At the same time, the mount table is shifted, so as to move the laser light L relative to the object 1 along the lines to cut 5.

The relative movement of the laser light L along the lines to cut 5 is performed six times for each line to cut 5 with respective different distances from the rear face 21 to the converging point P, so that one row of a quality modified region (second modified region) 71, three rows of divided modified regions (first modified regions) 72, and two rows of HC (half cut) modified regions (third modified regions) 73 are formed row by row along the line to cut 5 within the substrate 4 successively from the front face 3 side. Each of the modified regions 71, 72, 73 is a molten processed region since the substrate 4 is a semiconductor substrate made of silicon, but may include cracks.

When forming the quality modified region 71 and HC modified regions 73, the rate at which the laser light L is moved relative to the object 1 along the line to cut 5 (hereinafter simply referred to as "moving rate of laser light L") is 300 mm/sec. When forming the divided modified regions 72, in contrast, the moving rate of laser light L is 600 mm/sec. The repetition frequency of the light source for the laser light L is fixed at 80 kHz.

Figure 22:
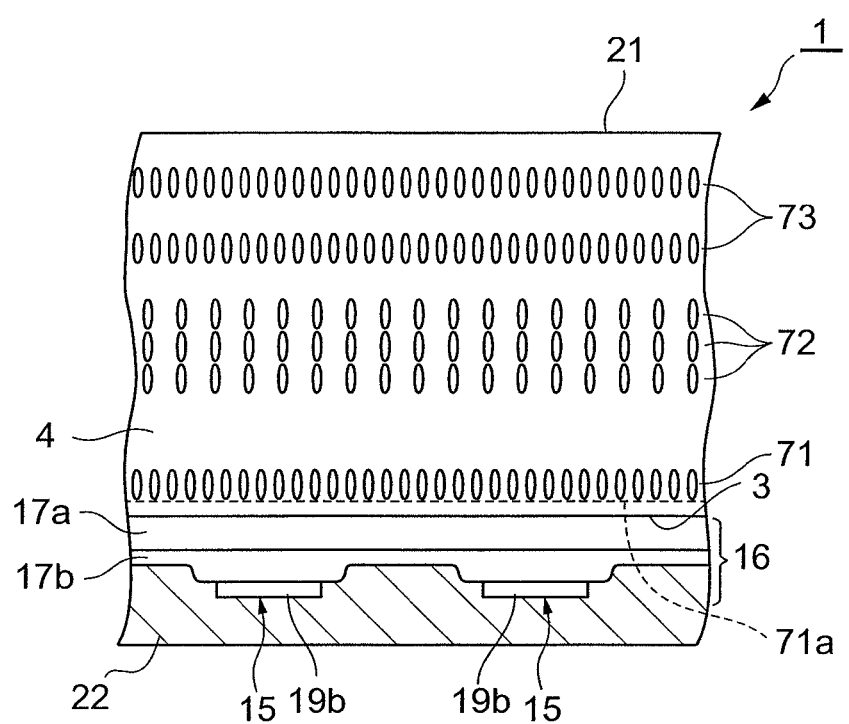
FIG. 22 is a partial sectional view of the object taken along the line XXII-XXII of FIG. 19(b)

Consequently, as shown in FIG. 22, the forming interval in the divided modified regions 72 formed by pulsed irradiation with the laser light L is greater than the forming interval in the quality modified region 71 and HC modified regions 73 formed by pulsed irradiation with the laser light L. Namely, the forming density of the divided modified regions 72 is lower than that of the quality modified region 71 and that of the HC modified regions 73.

When forming the quality modified region 71, one row of the quality modified region 71 is formed such that the distance from the front face 3 of the substrate 4 to the front-side end part 71a of the quality modified region 71 becomes 5 µm to 20 µm. When forming the divided modified regions 72, three rows of the divided modified regions 72 are formed in series in the thickness direction of the substrate 4. When forming the HC modified regions 73, two rows of the HC modified regions 73 are formed as shown in FIG. 19(b), so as to generate a fracture 24 along the line to cut 5 from the HC modified regions 73 to the rear face 21 of the substrate 4. (Depending on the forming condition, the fracture 24 may also occur between the divided modified region 72 and HC modified region 73 that are adjacent to each other.)

Figure 20:
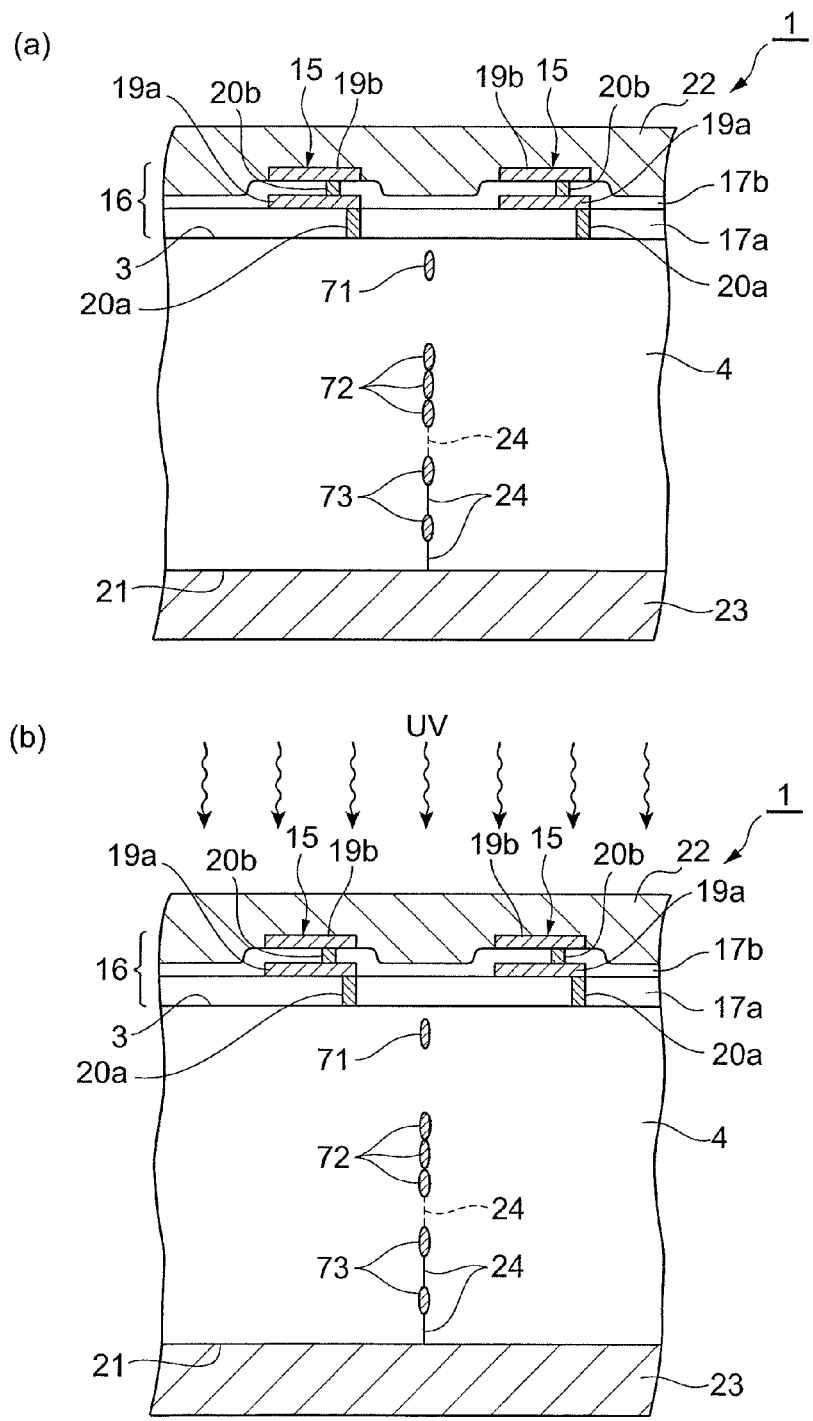
FIG. 20 is a view for explaining the laser processing method in accordance with the first embodiment, in which (a) is a state where an expandable tape is attached to the object, and (b) is a state where the protective tape is irradiated with UV rays.

After forming the modified regions 71, 72, 73, an expandable tape 23 is attached to the rear face 21 of the substrate 4 of the object 1 as shown in FIG. 20(a). Subsequently, the protective tape 22 is irradiated with UV rays as shown in FIG. 20(b), so as to lower its adhesive force, and the protective tape 22 is peeled off from the multilayer part 16 of the object 1 as shown in FIG. 21(a).

Figure 21:
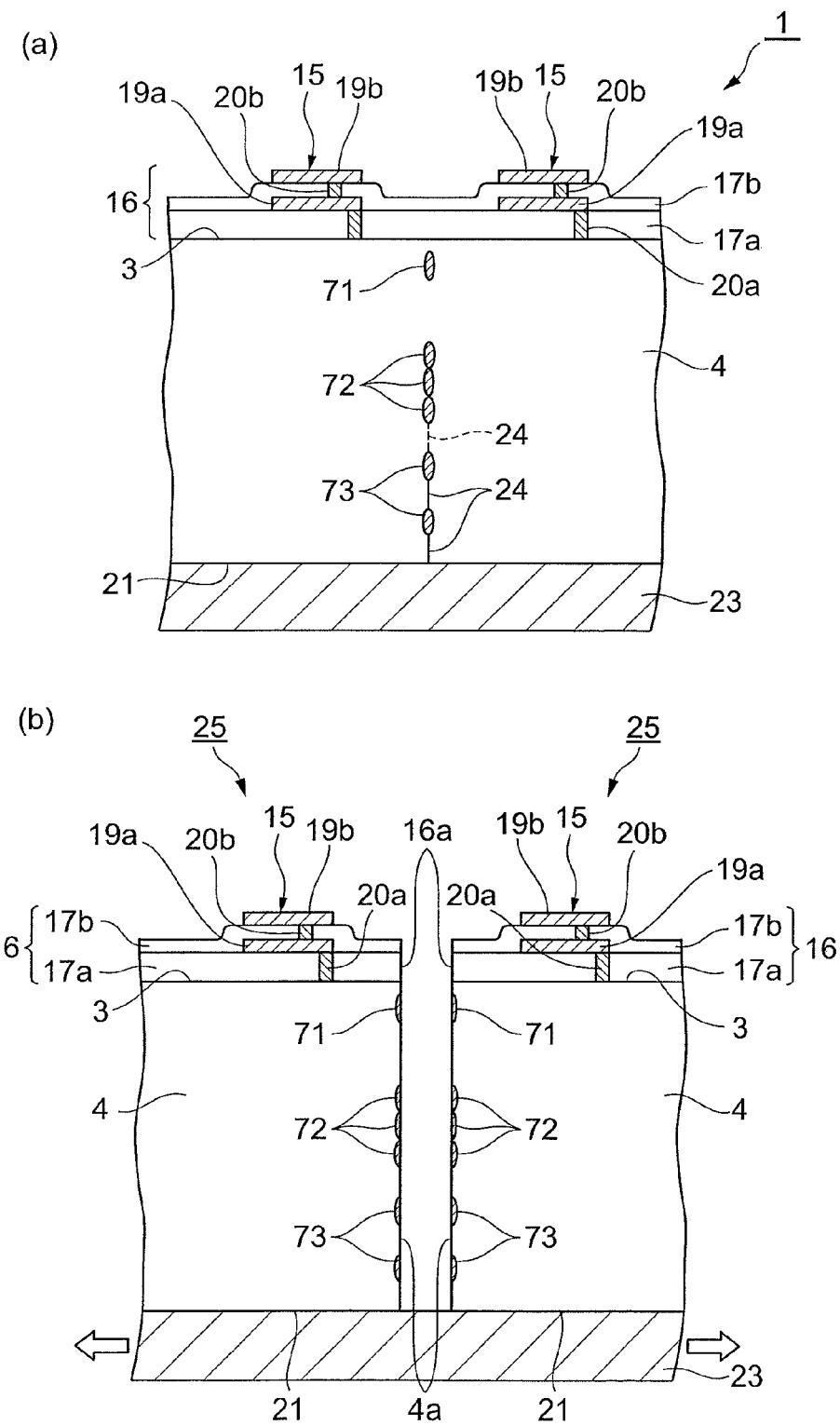
FIG. 21 is a view for explaining the laser processing method in accordance with the first embodiment, in which (a) is a state where the protective tape is peeled off from the object, and (b) is a state where the expandable tape is expanded.

After peeling off the protective tape 22, the expandable tape 23 is expanded as shown in FIG. 21(b), so as to generate fractures from the modified regions 71, 72, 73 acting as start points, thereby cutting the object 1 into the functional devices 15 along the lines to cut 5 and separating thus cut semiconductor chips 25 from each other.

As explained in the foregoing, the moving rate of laser light L (600 mm/sec) at the time of forming the divided modified regions 72 is faster than the moving rate of laser light L (300 mm/sec) at the time of forming the quality modified region 71 and HC modified regions 73 in the above-mentioned laser processing method. Consequently, the forming density of the divided modified regions 72 is lower than that of the quality modified region 71 and that of the HC modified regions 73. This can reduce the time required for forming all the modified regions 71, 72, 73 for one line to cut 5 as compared with the case where the forming density of the divided modified regions 72 is equal to that of the quality modified region 71 and that of the HC modified regions 73.

Specifically, while it took about 1.0 sec to form all the modified regions 71, 72, 73 for one line to cut 5 when the moving rate of laser light L was fixed at 300 mm/sec, the above-mentioned laser processing method required only about 0.5 sec. While it took about 342 sec to form all the modified regions 71, 72, 73 within the substrate 4 when the moving rate of laser light L was fixed at 300 mm/sec, the above-mentioned laser processing method required only about 256.5 sec.

Meanwhile, the quality modified region 71 and HC modified regions 73 are more influential on the cutting quality of the object 1 than are the divided modified regions 72. The multilayer part 16 formed on the front face 3 of the substrate 4 can be cut accurately along the line to cut 5 together with the substrate 4 when the quality modified region 71 is formed such that the distance from the front-side end part 71a of the modified region 71 to the front face 3 of the substrate 4 is 5 µm to 20 µm, for example. When the HC modified regions 73 are formed such that the fractures 24 along the line to cut 5 occur from the HC modified regions 73 to the rear face 21 of the substrate 4, the fractures 24 proceed smoothly toward the front face 3 of the substrate 4 through the divided modified regions 72 and quality modified region 71 at the time of expanding the expandable tape 23, for example, whereby the object 1 can be cut accurately along the line to cut 5.

Since the forming density of the quality modified region 71 and HC modified regions 73, which are more influential on the cutting quality of the object 1, is higher than that of the divided modified regions 72 in the above-mentioned laser processing method, the cutting quality of the object 1 can be prevented from deteriorating.

Since the modified regions 71, 72, 73 are formed row by row successively from the side remote from the rear face 21 of the substrate 4 in the above-mentioned laser processing method, no modified region exists between the rear face 21 acting as the laser light entrance surface and the converging point P of laser light L when forming each of the modified regions 71, 72, 73. Therefore, the laser light L is prevented from being scattered, absorbed, and so forth by modified regions which have already been formed. Hence, the modified regions 71, 72, 73 can be formed accurately within the substrate 4 along the line to cut 5.

Since the rear face 21 of the substrate 4 is used as the laser light entrance surface, the above-mentioned laser processing method can reliably form the modified regions 71, 72, 73 within the substrate 4 along the lines to cut 5 even if a member (e.g., TEG) reflecting the laser light L exists on the line to cut 5 in the multilayer part 16.

In the semiconductor chips 25 cut by using the foregoing laser processing method, cut sections (side faces) 4a of the substrate 4 formed with the modified regions 71, 72, 73 and cut sections 16a of the multilayer part 16 become high-precision cut sections in which irregularities are suppressed as shown in FIG. 21(b).

Second Embodiment

The second embodiment of the present invention will now be explained. The laser processing method of the second embodiment differs from that of the first embodiment in that its laser light entrance surface is the front face 3 of the substrate 4 instead of the rear face 21 of the substrate 4.

Figure 23:
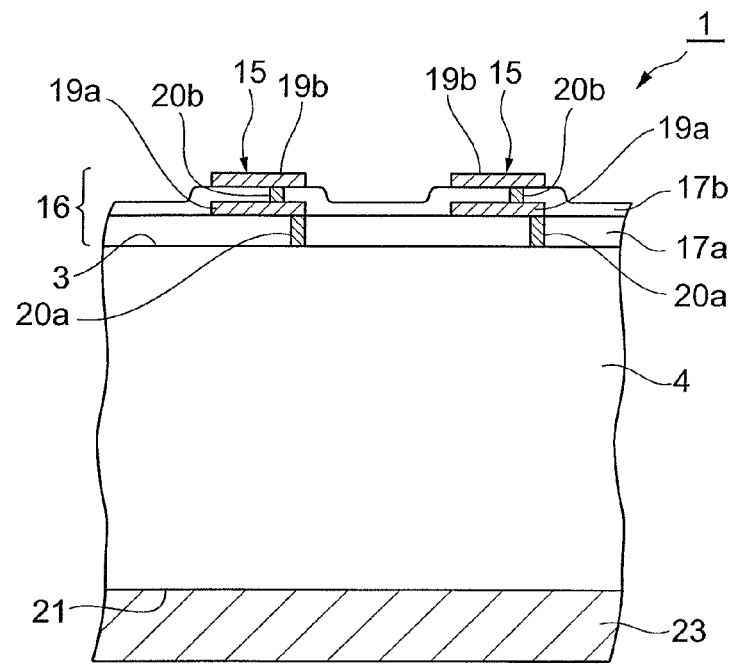
FIG. 23 is a view for explaining the laser processing method in accordance with a second embodiment, in which (a) is a state where an expandable tape is attached to the object, and (b) is a state where the object is irradiated with laser light.
Figure 23:
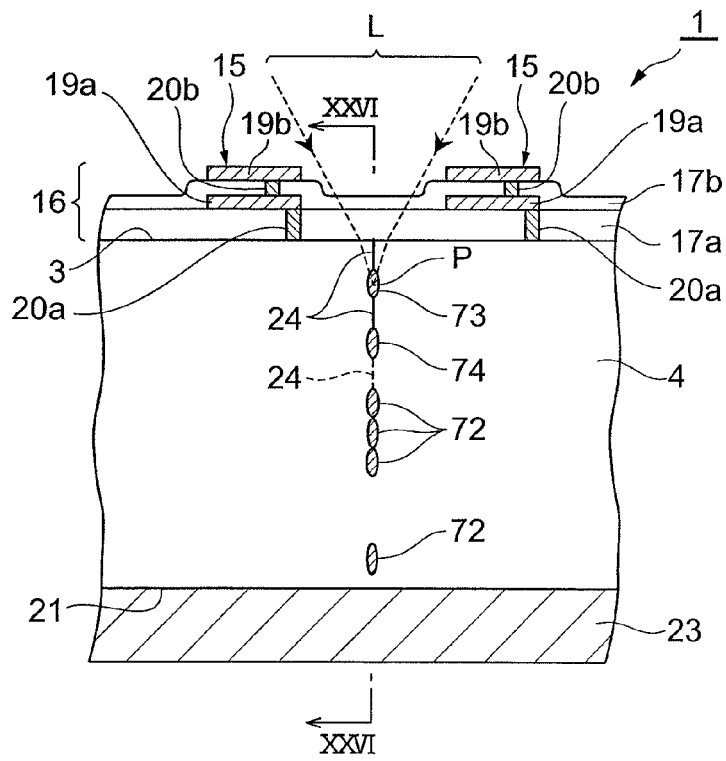

Namely, as shown in FIG. 23(a), the expandable tape 23 is attached to the rear face 21 of the substrate 4. Subsequently, as shown in FIG. 23(b), the object 1 is fixed onto a mount table (not depicted) of a laser processing apparatus such that the multilayer part 16 faces up.

Then, lines to cut 5 are set like grids (see broken lines in FIG. 17) so as to pass between the functional devices 15, 15 adjacent to each other, and the substrate 4 is irradiated with laser light L under a condition generating multiphoton absorption while using the rear face 21 as a laser light entrance surface and locating a converging point P within the substrate 4. At the same time, the mount table is shifted, so as to move the laser light L relative to the object 1 along the lines to cut 5.

The relative movement of the laser light L along the lines to cut 5 is performed six times for each line to cut 5 with respective different distances from the front face 3 to the converging point P, so that four rows of divided modified regions (third modified regions) 72, one row of an auxiliary HC modified region (first modified region) 74, and one row of an HC modified region (second modified region) 73 are formed row by row along the line to cut 5 within the substrate 4 successively from the rear face 21 side.

When forming the divided modified regions 72 and HC modified region 73, the moving rate of laser light L is 300 mm/sec. When forming the auxiliary HC modified region 74, in contrast, the moving rate of laser light L is 600 mm/sec.

Figure 26:
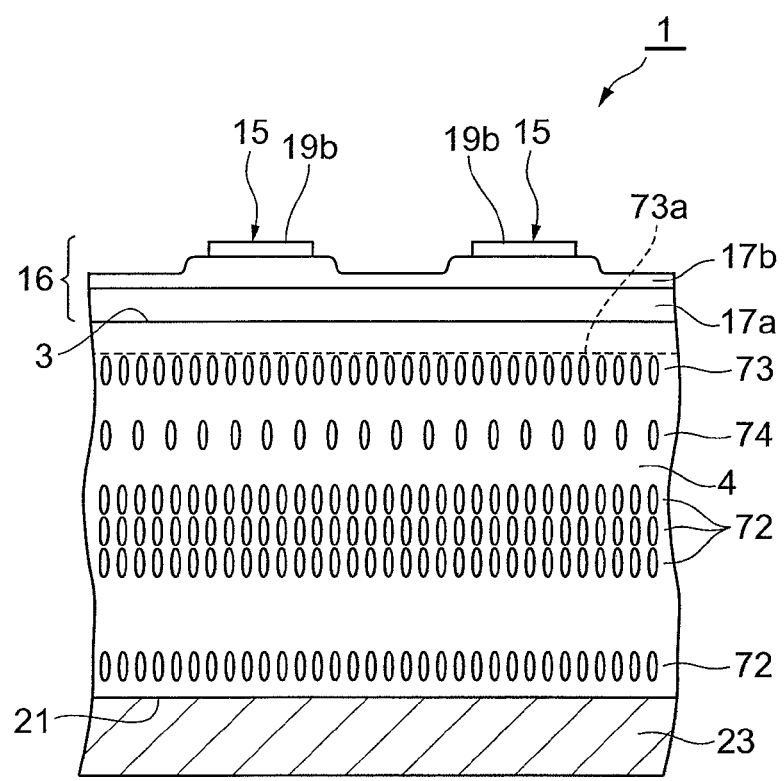
FIG. 26 is a partial sectional view of the object taken along the line XXVI-XXVI of FIG. 23(b).

Consequently, as shown in FIG. 26, the forming interval in the auxiliary HC modified region 74 formed by pulsed irradiation with the laser light L is greater than the forming interval in the divided modified regions 72 and HC modified region 73 formed by pulsed irradiation with the laser light L. Namely, the forming density of the auxiliary HC modified region 74 is lower than that of the divided modified regions 72 and that of the HC modified region 73.

When forming the HC modified region 73, one row of the HC modified region 73 is formed such that the distance from the front face 3 of the substrate 4 to the front-side end part 73a of the HC modified region 73 becomes 30 µm to 80 µm. Before forming the HC modified region 73, one row of the auxiliary HC modified region 74 is formed as shown in FIG. 23(b), so as to generate a fracture 24 along the line to cut 5 from the auxiliary HC modified region 74 to the front face 3 of the substrate 4. (Depending on the forming condition, the fracture 24 may also occur between the divided modified region 72 and auxiliary HC modified region 74 that are adjacent to each other.)

Figure 24:
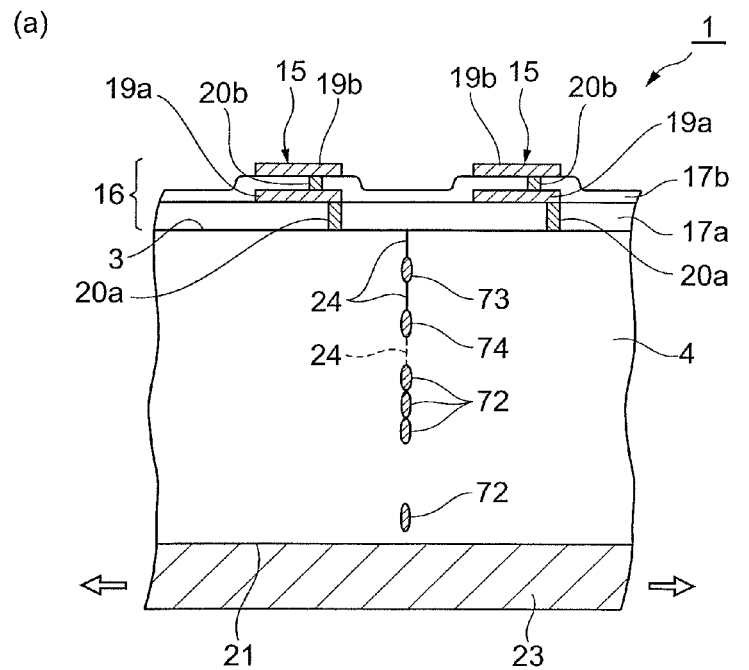
FIG. 24 is a view for explaining the laser processing method in accordance with the second embodiment, in which (a) is a state where the expandable tape is expanded, and (b) is a state where a knife edge is pressed against the object.
Figure 24:
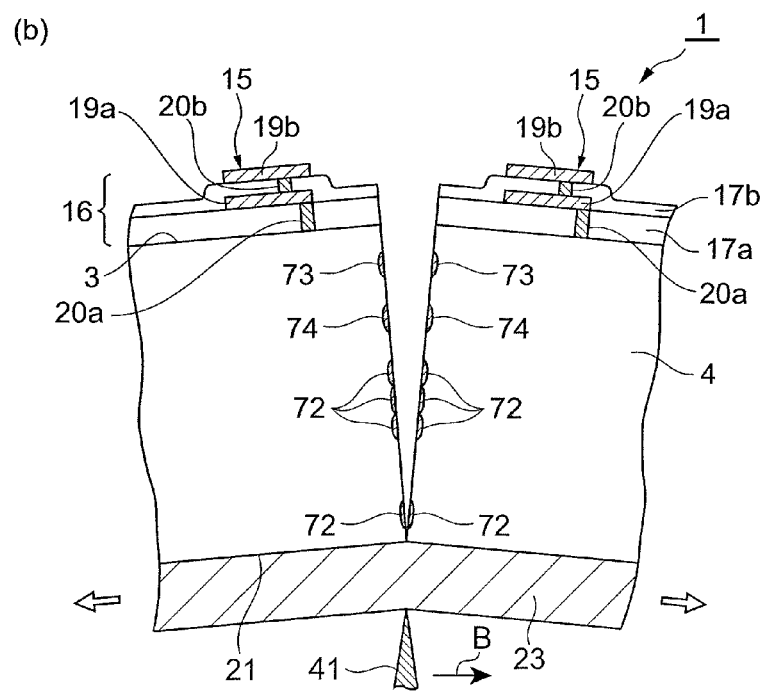

After forming the modified regions 72, 73, 74, the expandable tape 23 is expanded as shown in FIG. 24(a). In this state, as shown in FIG. 24(b), a knife edge 41 is pressed against the rear face 21 of the substrate 4 through the expandable tape 23 and moved in the direction of arrow B. This causes such a stress in the object 1 as to open the fractures 74, so that the fractures 24 extend toward the multilayer part 16 and divided modified regions 72, whereby the object 1 is cut along the line to cut 5.

Figure 25:
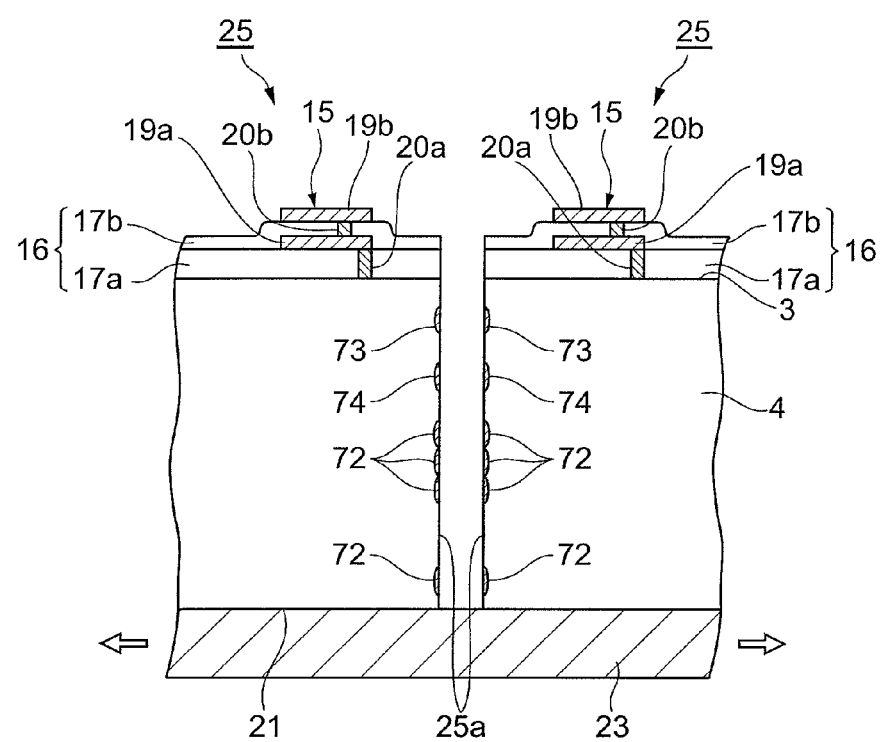
FIG. 25 is a view for explaining the laser processing method in accordance with the second embodiment, illustrating a state where the object is cut into semiconductor chips.

Since the expandable tape 23 attached to the rear face 21 of the substrate 4 is in the expanded state here, the semiconductor chips 25 obtained by cutting will be separated from each other immediately after the object 1 is cut as shown in FIG. 25.

As explained in the foregoing, the moving rate of laser light L (600 mm/sec) at the time of forming the auxiliary modified region 74 is faster than the moving rate of laser light L (300 mm/sec) at the time of forming the divided modified regions 72 and HC modified region 73 in the above-mentioned laser processing method. Consequently, the forming density of the auxiliary HC modified region 74 is lower than that of the divided modified regions 72 and that of the HC modified region 73. This can reduce the time required for forming all the modified regions 72, 73, 74 for one line to cut 5 as compared with the case where the forming density of the divided modified regions 74 is equal to that of the divided modified regions 72 and that of the HC modified region 73.

Since the forming density of the auxiliary HC modified region 74 is lower than that of the HC modified region 73, the fractures 24 are hard to reach the front face 3 of the substrate 4 at the time when the auxiliary HC modified region 74 is formed. This can restrain molten reservoirs from being formed by the converging point P of laser light L located at the fractures 24 when forming the HC modified region 73. As a result, dust can be prevented from being generated by the forming of molten reservoirs at the time when cutting the object 1 along the line to cut 5.

When the HC modified region 73 is formed such that the distance between the front-side end part 73a of the HC modified region 73 and the front face 3 of the substrate 4 becomes 30 µm to 80 µm, the straightforwardness of the fractures 24 occurring from the auxiliary HC modified region 74 to the HC modified region 73 can be improved. Further, when the HC modified region 73 is formed such that the fractures 24 along the line to cut 5 occur from the modified region 73 to the front face 3 of the substrate 4, the straightforwardness of the line to cut 5 can be improved.

The present invention is not limited to the above-mentioned embodiments.

For example, the number of rows of divided modified regions 72 is not limited to 3 (in the first embodiment) or 4 (in the second embodiment), but may be any number as long as fractures can proceed smoothly in the thickness direction of the substrate 4. In general, the number of rows of divided modified regions 72 decreases and increases as the substrate 4 is thinner and thicker, respectively. The divided modified regions 72 may be separated from each other as long as fractures can proceed smoothly in the thickness direction of the substrate 4. In the first embodiment, the number of rows of HC modified regions 73 may be 1 as long as the fracture 24 can reliably occur from the HC modified region 73 to the rear face 21 of the substrate 4.

Though the above-mentioned embodiments relate to cases where the multilayer part 16 is formed on the line to cut 5 in the front face 3 of the substrate 4, there are cases where no multilayer part 16 is formed on the line to cut 5 in the front face 3 of the substrate 4.

INDUSTRIAL APPLICABILITY

The present invention can cut an object to be processed comprising a substrate and a plurality of functional devices formed on the front face of the substrate along a line to cut accurately in a short time even when the substrate is thick.

The invention claimed is:

1. A semiconductor chip comprising a substrate and a plurality of functional devices formed on a front face of the substrate;

wherein a side face of the substrate is formed with at least one row of a first modified region, at least one row of a second modified region positioned between the first modified region and the front face of the substrate, and at least one row of a third modified region positioned between the first modified region and a rear face of the substrate; and wherein, in the side face, a forming density per row of the first modified region extending in a direction orthogonal to a thickness direction of the substrate is lower than a forming density per row of the second modified region and a forming density per row of the third modified region extending in the direction orthogonal to the thickness direction.

* * * * *